United States Patent

Miks et al.

[11] Patent Number: 5,903,051
[45] Date of Patent: May 11, 1999

[54] ELECTRONIC COMPONENT AND METHOD OF MANUFACTURE

[75] Inventors: Jeffrey A. Miks, Chandler; Dilip D. Patel; Dwight L. Daniels, both of Mesa, all of Ariz.

[73] Assignee: Motorola, Inc., Schaumburg, Ill.

[21] Appl. No.: 09/055,120

[22] Filed: Apr. 3, 1998

[51] Int. Cl.[6] .................. H01L 23/053; H01L 23/48; H01L 23/52

[52] U.S. Cl. .................. 257/700; 257/773; 257/698; 174/52.4

[58] Field of Search .................. 257/700, 697, 257/787, 713, 773, 698; 174/52.4, 255

[56] References Cited

U.S. PATENT DOCUMENTS

| | | | |
|---|---|---|---|
| 4,729,971 | 3/1988 | Coleman | 436/462 |
| 4,922,324 | 5/1990 | Sudo | 257/700 |
| 4,976,814 | 12/1990 | Blumenshine et al. | 156/277 |
| 5,024,970 | 6/1991 | Mori | 438/462 |
| 5,208,656 | 5/1993 | Matsuyama et al. | 257/700 |
| 5,258,891 | 11/1993 | Sako | 257/700 |
| 5,286,343 | 2/1994 | Hui | 156/345 |
| 5,310,104 | 5/1994 | Zaidel et al. | 29/413 |
| 5,336,456 | 8/1994 | Eskildsen et al. | 264/157 |
| 5,521,125 | 5/1996 | Ormond et al. | 438/465 |
| 5,616,954 | 4/1997 | Tobase | 257/700 |
| 5,665,655 | 9/1997 | White | 438/584 |

FOREIGN PATENT DOCUMENTS 2596615 4/1997 Japan .

*Primary Examiner*—Mahshid Saadat
*Assistant Examiner*—Jhihan B Clark
*Attorney, Agent, or Firm*—George C. Chen

[57] ABSTRACT

An electronic component can be more easily tested after being mounted onto a circuit board (660). The component also stops cracks from propagating over vital areas of a substrate (110). The component includes an electrically insulative substrate (100), electrically conductive traces (120) supported by the electrically insulative substrate (100), and an electrically insulative layer (310) covering inner and outer portions of the electrically conductive traces (120) while middle portions of the electrically conductive traces (120) remain exposed.

23 Claims, 3 Drawing Sheets

ELECTRONIC COMPONENT AND METHOD OF MANUFACTURE

BACKGROUND OF THE INVENTION

This invention relates, in general, to electronics, and more particularly, to electronic components and methods of manufacturing.

Often used as leadframes for large integrated circuits, ball grid array substrates typically have copper traces underneath permanent solder masks. A solder mask can have openings for mounting a semiconductor chip onto the substrate and for electrically coupling the copper traces to the integrated circuit in the semiconductor chip.

Ball grid array substrates are usually made in strips, with several substrates in each strip. However, when a ball grid array substrate is singulated from the strip, the solder mask often cracks and creates reliability problems.

Furthermore, to provide protection from electro-static discharge, all of the copper traces can be electrically shorted together along a perimeter of the ball grid array substrate. When a ball grid array substrate is singulated from the strip, the copper traces are cut and electrically isolated from each other. However, the forces exerted on the copper traces during the removal process often peels the ends of the copper traces off of the underlying ball grid array substrate material. The copper trace peeling causes undesired electrical shorting of the copper traces, among other problems.

Moreover, after the ball grid array substrate is mounted onto a circuit board, it is extremely difficult to individually test the semiconductor chip.

Accordingly, a need exists for an electronic component and method of manufacturing that stops solder mask cracking, prevents copper trace peeling, and provides easy access for electrical testing after mounting the electronic component on a circuit board.

BRIEF DESCRIPTION OF THE DRAWINGS

For simplicity and clarity of illustration, elements in the drawings are not necessarily drawn to scale, and the same reference numerals in different figures denote the same elements.

DETAILED DESCRIPTION OF THE DRAWINGS

Figure 1:
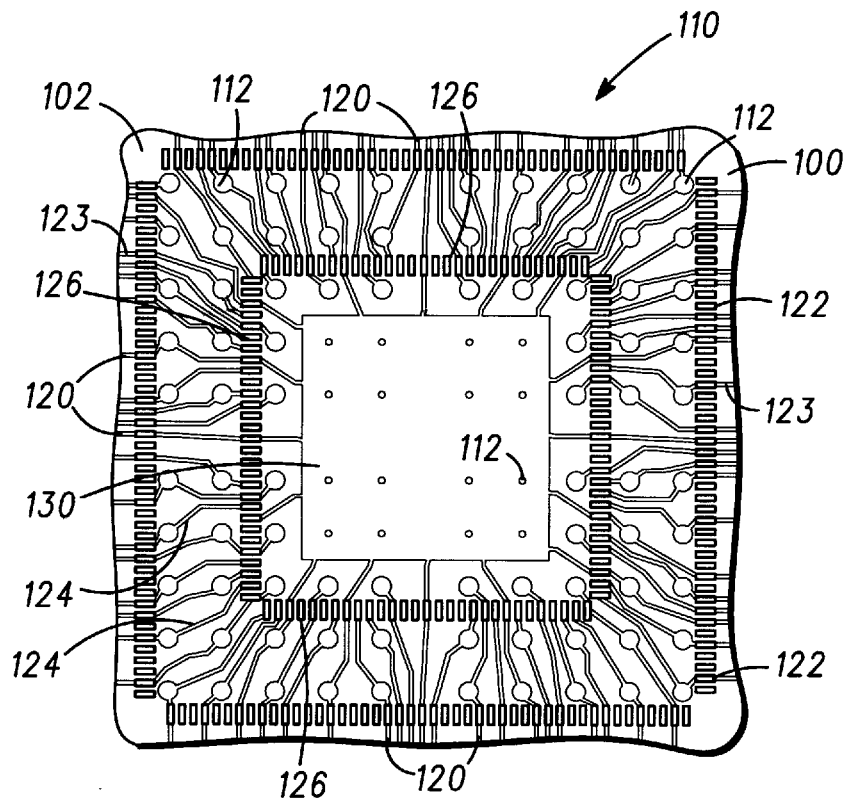
FIG. 1 illustrates a top view of an embodiment of an electronic substrate in accordance with the present invention.
Figure 2:
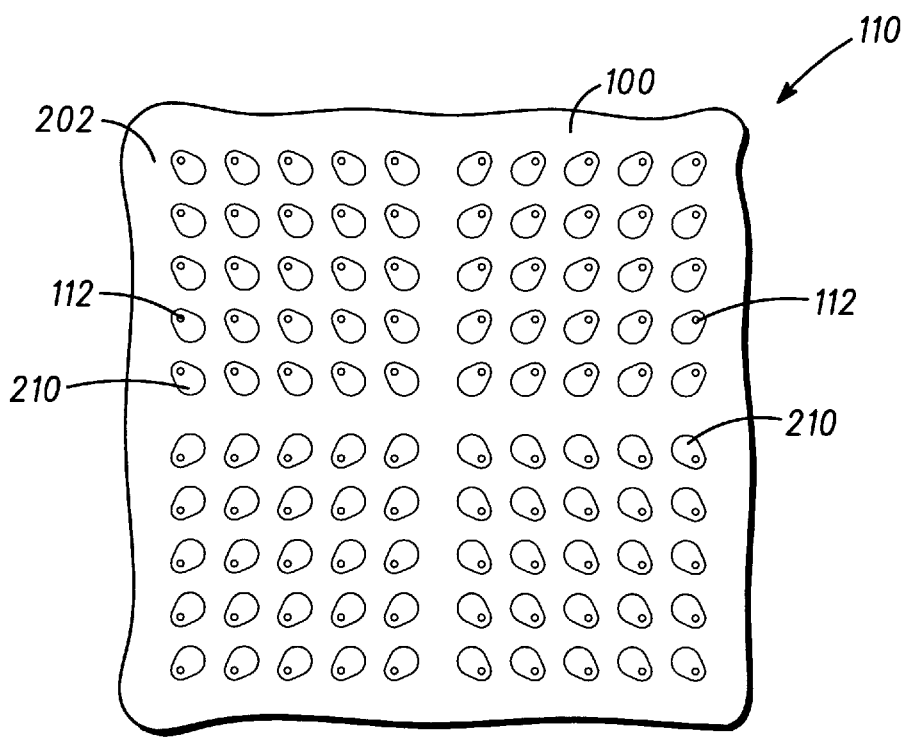
FIG. 2 illustrates a bottom view of the electronic substrate of FIG. 1 in accordance with the present invention.

FIG. 1 illustrates a top view of an electronic substrate 110, and FIG. 2 illustrates a bottom view of substrate 110. Substrate 110 includes, among other features, an electrically insulative substrate 100 having a top surface 102 (FIG. 1), a bottom surface 202 (FIG. 2) opposite surface 102, and edges coupling together surfaces 102 and 202. As an example, substrate 100 can be comprised of a polyimide or other organic material. An array of holes or vias 112 extend completely through substrate 100 from surface 102 to surface 202. In the preferred embodiment, all of vias 112 are located at a central or inner portion of substrate 100, and a perimeter or outer portion of substrate 100 is located around, surrounds, or circumscribes the inner portion of substrate 100. A middle portion of substrate 100 can be located between and contiguous with the inner and outer portions of substrate 100. The inner, middle, and outer portions of substrate 100 are explained in more detailed hereinafter. As an example, substrate 110 can be a ball grid array substrate or a pin grid array substrate.

Substrate 110 also includes electrically conductive paths or traces 120 overlying, supported by, and in physical contact with surface 102 of substrate 100. Each of traces 120 includes an inner portion 124, a middle portion 122, an outer portion 123, and a bonding pad 126. Each of traces 120 preferably extends radially from the inner portion of substrate 100 to the outer portion of substrate 100. In this embodiment, each inner portion 124 of each of traces 120 preferably overlies and electrically couples at least one via 112 to at least one pad 126. Furthermore, middle portions 122 and outer portions 123 of each of traces 120 are preferably located over the middle and outer portions, respectively, of substrate 100 and form a border around all of vias 112. The inner, outer, and middle portions of substrate 100 can be vertically aligned between the top and bottom surfaces. This layout of traces 120 facilitates electrical testing, as described hereinafter.

Substrate 110 further includes an optional metallized die attach area 130, which in accordance with the preferred radial pattern of traces 120, is preferably located over the center of the inner portion of surface 102 of substrate 100. Area 130 can be located over and directly electrically coupled to some of vias 112, and area 130 can also be electrically coupled to others of vias 112 through traces 120.

In FIG. 2, additional electrically conductive traces 210 are located at surface 202 of substrate 100 and are electrically coupled to traces 120 and area 130 through vias 112. As an example, traces 120 and 210 can both be comprised of a metal such as copper, aluminum, gold, or the like.

Figure 3:
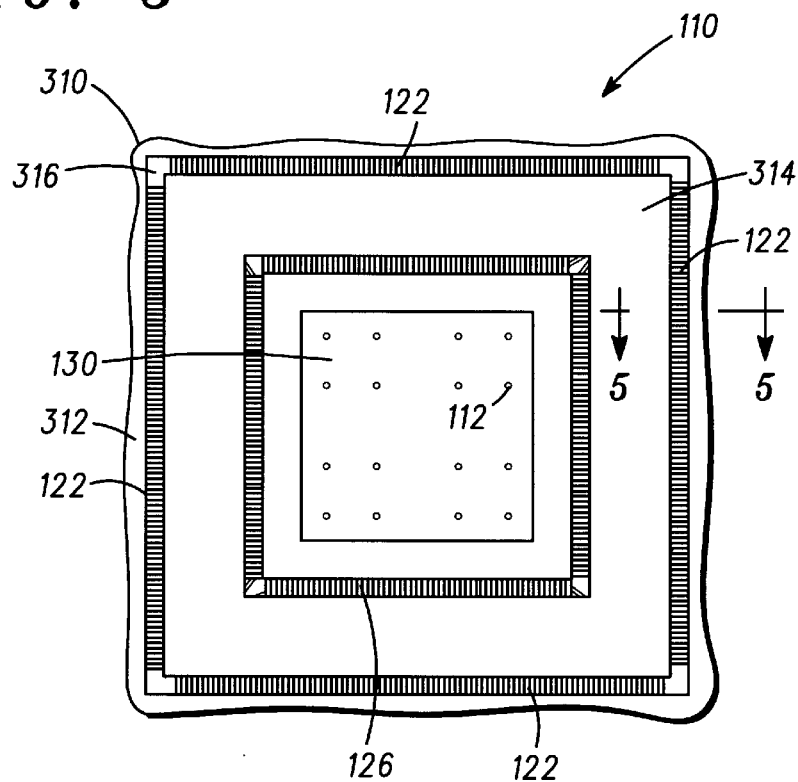
FIG. 3 illustrates a top view of the electronic substrate of FIG. 1 after additional processing in accordance with the present invention.

FIG. 3 illustrates a top view of electronic substrate 110 after additional processing. An electrically insulative material or layer 310 is disposed or formed to physically contact surface 102 of substrate 100. Layer 310 includes an outer portion 312 surrounding or circumscribing an inner portion 314. Portion 314 of layer 310 covers portions 124 of traces 120 and covers vias 112. Portion 314 can be devoid of cover area 130. Portion 314 does not cover pads 126 to permit wire bonds to couple a semiconductor device to traces 120, as also explained in more detail hereinafter.

Portion 312 of layer 310 covers portions 123 of traces 120. However, neither portion 312 nor portion 314 of layer 310 covers portions 122 of traces 120. Instead, portions 312 and 314 are absent over portions 122, which are exposed by a space or gap 316 located between portions 312 and 314 of layer 310.

In the preferred embodiment, portion 314 of layer 310 covers all of vias 112, except for those covered by area 130, while gap 316 and portion 312 of layer 310 are devoid of covering any of vias 112. Gap 316 preferably continuously circumscribes or forms a complete border around vias 112 and around portion 314 of layer 310. A width of gap 316 between portions 312 and 314 is preferably greater than a distance of fifty micrometers to provide electrical test point access to traces 120, as explained in more detail hereinafter. In addition to providing electrical test point access, gap 316 is also used to stop cracks in portion 312 of layer 310 from propagating into portion 314 of layer 310, as explained in more detail hereinafter. Cracks in portion 312 do not significantly affect the reliability of substrate 110. However, cracks in portion 314 significantly degrade the reliability of substrate 110 by creating stress concentration points over the vital circuitry of substrate 110 including vias 112 and portions 124 of traces 120. Therefore, gap 316 should be located outside all of vias 112, portions 124, and pads 126 of traces 120.

Figure 4:
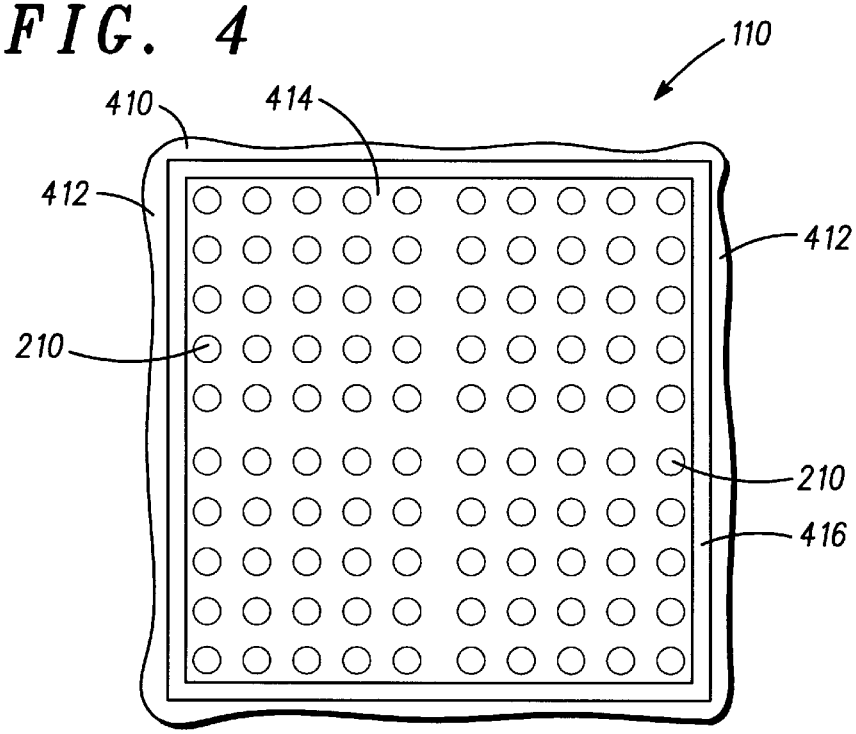
FIG. 4 illustrates a bottom view of the electronic substrate of FIG. 1 after the additional processing in accordance with the present invention.

FIG. 4 illustrates a bottom view of electronic substrate 110 after the additional processing described in FIG. 3. Another electrically insulative material or layer 410 covers surface 202 of substrate 100. Layer 410 includes an outer portion 412 surrounding or circumscribing an inner portion 414. Portion 414 preferably covers all of vias 112 along surface 202 of substrate 100, and portion 412 is preferably devoid of covering any of vias 112. Portion 414 covers the regions of traces 210 that electrically connect to vias 112, but portion 414 also leaves other regions of traces 210 exposed. These exposed regions of traces 210 permit the electrical connection of substrate 110 to a circuit board. As an example, electrical interconnect structures such as solder balls can be formed on the exposed regions of traces 210. In the embodiment illustrated in FIG. 4, most of the solder balls are equally spaced apart from each other and would be electrically coupled to traces 120 at surface 102 of substrate 100 through traces 210 at surface 202 and vias 112.

Layer 410 includes a space or a gap 416 separating portions 412 and 414. Similar to gap 316 and portion 312 of layer 310, gap 416 and portion 412 of layer 410 preferably do not overlie any of traces 210 or vias 112. Instead, portion 412 and gap 416 of layer 410 preferably continuously circumscribe or completely surround and all of traces 210 and vias 112. Similar to portion 312 of layer 310, portion 412 of layer 410 preferably does not have any holes and preferably forms a continuous border around gap 416.

In the preferred embodiment, gap 416 is symmetrical to and directly underneath gap 316 of FIG. 3 in order to balance the mechanical stress across substrate 110. Layers 410 and 310 are also preferably comprised of identical materials and thicknesses in order to balance the mechanical stresses across substrate 110 and to facilitate the manufacturing of substrate 110. As an example, layers 310 and 410 can be plating or solder masks.

Figure 5:
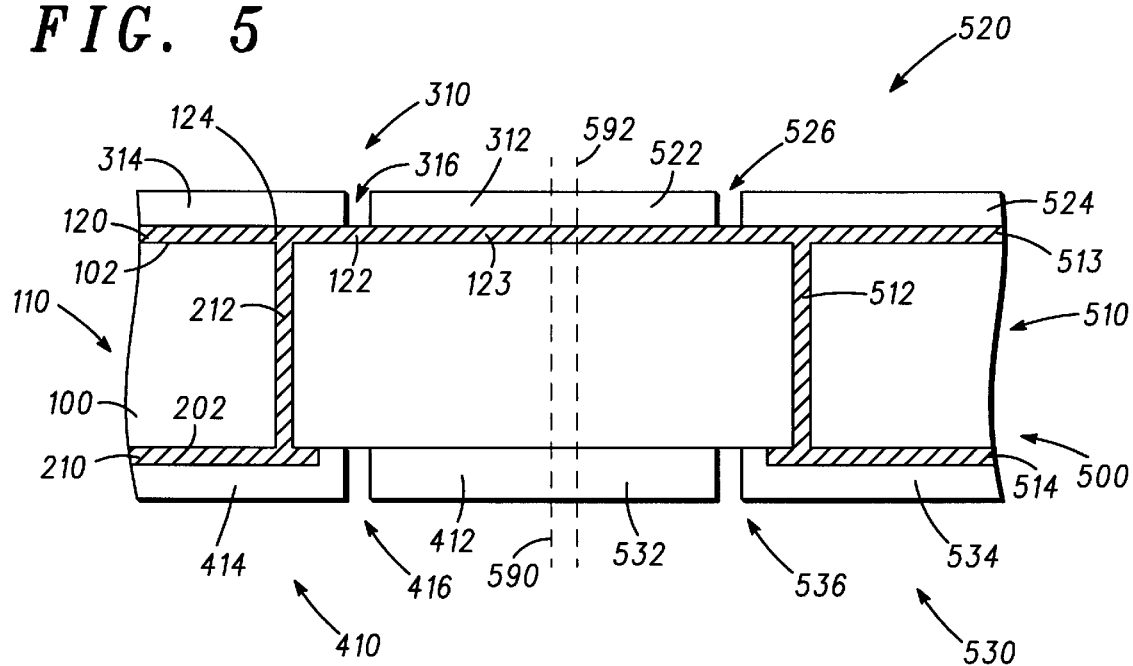
FIG. 5 illustrates a cross-sectional view of the electronic substrate of FIG. 3 taken along a section line 5—5 in accordance with the present invention.

FIG. 5 illustrates a cross-sectional view of electronic substrate 110 taken along a section line 5—5 in FIG. 3. Substrate 100 is typically formed in a sheet or strip 500, which is subsequently partitioned into a plurality of symmetrical substrates, including substrate 110 and a substrate 510. A dashed line 590 represents an edge of substrate 110, and a dashed line 592 represents an edge of substrate 510. The portion of substrate 100 between lines 590 and 592 is discarded. In an alternative embodiment, substrates 110 and 510 can be contiguous with each other in order to reduce the amount of substrate 100 that is wasted.

Substrate 510 includes holes or vias 512 and electrically conductive traces 513 and 514, which are similar to vias 112 and traces 120 and 210, respectively, of substrate 110. As illustrated in FIG. 5, traces 513 and portion 123 of traces 120 meet or are joined together between lines 590 and 592. Typically, traces 120 and 513 are comprised of the same materials and are simultaneously formed during the same processing steps.

Substrate 510 also includes a mask or layer 520 adjacent to surface 102 of substrate 100 and having a gap 526 and portions 522 and 524, which are similar to gap 316 and portions 312 and 314, respectively, of layer 310. Portion 522 of layer 520 and portion 312 of layer 310 meet or are joined together between lines 590 and 592. Typically, layers 310 and 520 are comprised of the same materials and are simultaneously formed during the same processing steps.

Substrate 510 further includes a mask or layer 530 adjacent to surface 202 of substrate 100 and having a gap 536 and portions 532 and 534, which are similar to gap 416 and portions 412 and 414, respectively, of layer 410. Portion 532 of layer 530 and portion 412 of layer 410 meet or are joined together between lines 590 and 592. Typically, layers 410 and 530 are comprised of the same materials and are simultaneously formed during the same processing steps.

Typically, a punching, coining, or stamping process is used to singulate substrates 110 and 510 from strip 500. The stamping processes for substrates 110 and 510 can be performed separately or simultaneously with each other. In an alternative embodiment, a sawing or scribing process or other processes known in the art can be used to singulate substrate 110 and 510 from strip 500.

The stamping process for substrate 110 includes stamping or punching through strip 500 at line 590 while clamping substrate 100 at four places: above portion 312 of layer 310 and to the left of line 590, above portion 312 and between line 590 and 592, below portion 412 of layer 410 and to the left of line 590, and below portion 412 and between line 590 and 592. Portion 314 of layer 310 and portion 414 of layer 410 are not subjected to the clamping forces in order to prevent the possibility of damaging the material that comprises portions 314 and 414 or the critical circuitry underlying portions 314 and 414. After singulating substrate 110 from strip 500, portion 123 of traces 120, portion 312 of layer 310, and portion 412 of layer 410 all extend to the edge of substrate 110.

The stamping process for substrate 510 includes stamping or punching through strip 500 at line 592 while clamping substrate 100 at four places: above portion 522 of layer 520 and to the right of line 592, above portion 522 and between lines 590 and 592, below portion 532 of layer 530 and to the right of line 592, and below portion 532 and between lines 590 and 592.

Portion 312 of layer 310 protects portion 123 of traces 120 during the stamping process for substrate 110. In particular, by forming portion 312 of layer 310 in the area located between 590 and 592 or the street of strip 500, by directly clamping on portion 312, and by leaving portion 312 over portion 123 of traces 120, there is no direct clamping on portion 123 of traces 120 during the stamping process. As a result, the force exerted on portion 123 of traces 120 is reduced, and the peeling of portion 123 of traces 120 off of surface 102 of substrate 100 is eliminated.

It is noted that clamping on portion 312 of layer 310 may crack portion 312. However, gap 316 arrests or prevents any cracks in portion 312 from spreading or propagating into portion 314 of layer 310, under which the vital portions of traces 120 are located. Gap 416 in layer 410 serves a similar function as gap 316 by preventing any cracks in the clamped portion 412 from spreading into portion 414 of layer 410, under which the vital portions of traces 210 are located. Cracks in portions 314 or 414 of layers 310 or 410, respectively, may produce stress concentration points coincident with traces 120 or 210 and degrade the reliability of substrate 110. Accordingly, gaps 316 and 416 should form a continuous border around portions 314 and 414, respectively, because any bridging between portions 314 and 312 or between portions 414 and 412 can serve as crack propagating conduits. Gaps 316 and 416 do not arrest crack propagation in substrate 100, but do arrest crack propagation in layers 310 and 410, respectively. This "crack arresting" feature of layers 310 and 410 improves the reliability of substrate 110 and the semiconductor device supported by substrate 110.

Figure 6:
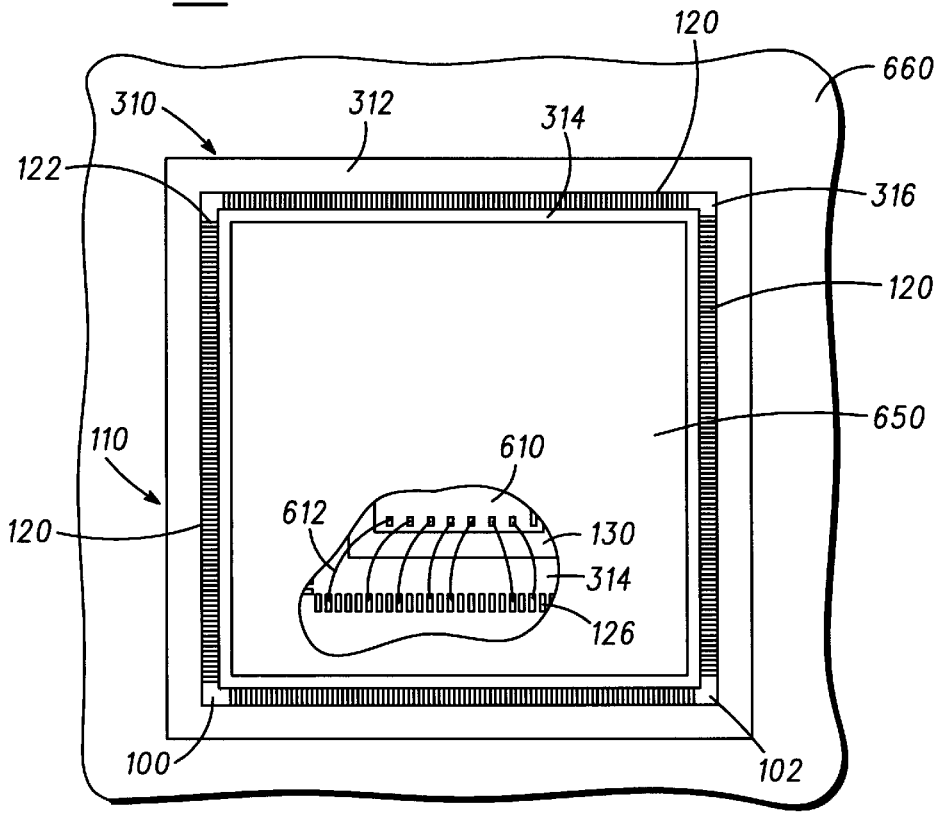
FIG. 6 illustrates a partial cut-away top view of an embodiment of an electronic component in accordance with the present invention.

FIG. 6 illustrates a partial cut-away top view of an electronic component 600. Component 600 can be formed by plating area 130 and traces 120 and 210 (FIG. 4) of substrate 110 with a solderable or bondable metal while layers 310 and 410 are used as plating masks. This plating process is performed before substrate 110 is singulated from strip 500 (FIG. 5). After the plating process, a semiconductor substrate 610 is mounted onto area 130, which can be covered by portion 314 of layer 310. Substrate 110 serves as a mounting substrate or leadframe for semiconductor substrate 610. Substrate 610 includes a semiconductor device such as a transistor, integrated circuit, or the like. Substrate 610 does not cover portion 122 of traces 120 for reasons explained hereinafter. Next, the semiconductor device is electrically coupled to traces 120. As an example, wire bonds 612 can be used to electrically connect the semiconductor device to pads 126, which are not covered by portion 314 of layer 310.

After the electrical coupling step, an encapsulant or packaging material 650 is provided, disposed, or otherwise deposited on portion 314 of layer 310 and around substrate 610 and wires 612. Material 650 is used to protect device substrate 610 and wires 612 from moisture, corrosion, contamination, physical impact, or the like. As an example, material 650 can be a glob top material, a hollow cap or housing, a recessed lid, or a high pressure, injection molded compound or encapsulant. As illustrated in FIG. 6, material 650 does not cover portion 312 or gap 316 of layer 310 and also does not cover portion 123 (located under portion 312 of layer 310 as illustrated in FIG. 5) or portion 122 of traces 120.

Next, although not illustrated in FIG. 6, electrical interconnect structures such as solder balls are positioned at surface 202 of substrate 110 over the exposed regions of traces 210. Portion 414 of layer 410 can be used as a registration mask for positioning the interconnect structures.

Then, substrate 110 is singulated from strip 500 using techniques described in FIG. 5. During the singulation step, gap 316 of layer 310 arrests or prevents any cracks in portion 312 of layer 310 from propagating into portion 314 of layer 310 and under material 650. This "crack arresting" feature improves the reliability of component 600. Accordingly, gap 316 should circumscribe all vital circuitry within substrate 110, including all of portions 124 of traces 120 and all of vias 112. Similarly, gap 316 should also circumscribe material 650 so that any cracks formed in portion 312 of layer 310 during the subsequent singulation step do not propagate underneath material 650. As explained earlier, gap 416 of layer 410 serves a similar function as gap 316 by arresting or preventing any cracks in portion 412 of layer 410 from propagating into portion 414 of layer 410, which overlies vital circuitry including traces 210 and vias 112. Gaps 316 and 416 are part of the finished component 600.

Subsequently, the electrical interconnect structures or solder balls are mounted onto and electrically coupled to a circuit board 660. In this configuration, surface 202 of substrate 100 faces towards board 660 and surface 102 of substrate 100 faces away from board 660. After substrate 110 is mounted onto board 660, the semiconductor device in substrate 610 can still be easily tested because portions 122 of traces 120 remain exposed. Portions 122 are not covered by layer 310, semiconductor substrate 610, or packaging material 650. Therefore, electrical probes can be aligned to the exposed traces to individually test the semiconductor device. Accordingly, gap 316 should be wide enough to permit electrical probes to contact portions 122 of traces 120.

Therefore, an improved electronic component and method of manufacture is provided to overcome the disadvantages of the prior art. The mounting substrate or leadframe of the electronic component has a unique layer that has a plurality of uses and that provides a plurality of advantages. First, the layer can be used as a plating or solder mask. Second, the layer protects underlying electrical traces from direct clamping forces during a singulation step and prevents the traces from peeling off of the substrate. The singulation step may crack a perimeter portion of the layer. However, a gap in the layer prevents the cracks from propagating from the perimeter portion into a central portion of the layer that overlies vital circuitry. Furthermore, the gap in the layer also exposes and provides access to the electrical traces to facilitate the electrical testing of the electronic component after the electronic component is mounted onto a circuit board.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, the specific layout of the electrically conductive traces and the vias are provided to facilitate the understanding of the present invention and are not provided to limit the scope of the invention. As another example, if substrate 110 did not require electrostatic discharge protection, then traces 120 do not have to be electrically shorted together before being singulated from strip 500. In this embodiment, portions 123 of traces 120 (FIG. 5) do not have to extend to the edges of substrate 110 after substrate 110 is singulated from strip 500. In another alternative embodiment, layer 310 (FIG. 3) can include a plurality of gaps circumscribing portion 314 of layer 310, or layer 310 can include a plurality of gaps located with portion 314 of layer 310 to provide additional safeguards against crack propagation. In yet another alternative embodiment, outer portion 412 of layer 410 (FIG. 4) does not have to be continuous when traces 210 do not underlie portion 412.

Accordingly, the disclosure of the present invention is not intended to be limiting. Instead, the disclosure of the present invention is intended to be merely illustrative of the scope of the invention, which is set forth in the following claims.

We claim:

1. An electronic component comprising:

an electrically insulative substrate having first and second surfaces opposite each other;

electrically conductive paths supported by the first surface of the electrically insulative substrate; and an electrically insulative material covering the electrically conductive paths, the electrically insulative material having a first ring portion and a second ring portion circumscribing the first ring portion, wherein the first and second ring portions are non-contiguous with each other, wherein a first portion of the electrically conductive paths is exposed between the first and second ring portions of the electrically insulative material, and wherein a second portion of the electrically conductive paths is exposed beyond the second ring portion of the electrically insulative material.

2. The electronic component of claim 1 further comprising:
   a semiconductor substrate over the electrically insulative substrate and absent over the electrically insulative substrate; and
   an encapsulant over the semiconductor substrate, over the electrically insulative substrate, over the first and second ring portions of the electrically insulative material, over the first portion of the electrically conductive paths, and absent over the second portion of the electrically conductive paths.

3. The electronic component of claim 1 wherein the electrically insulative substrate has vias electrically coupled to the electrically conductive paths and extending completely through the electrically insulative substrate.

4. The electronic component of claim 1 further comprising an other electrically insulative material covering the second surface of the electrically insulative substrate wherein the other electrically insulative material has a gap:
   wherein a gap in the electrically insulative material separates the first and second ring portions from each other and exposes the first portion of the electrically conductive paths and wherein the gap of the other electrically insulative material underlies the first portion of the electrically conductive paths and underlies the gap of the electrically insulative material.

5. The electronic component of claim 1 wherein the electrically insulative substrate further comprises vias extending through the electrically insulative substrate wherein the first and second ring portions of the electrically insulative material cover all of the vias.

6. The electronic component of claim 1 wherein a gap in the electrically insulative material completely separates the first and second ring portions from each other and wherein the gap has a substantially constant width greater than approximately fifty micrometers.

7. The electronic component of claim 1 wherein the electrically insulative material further comprises a third rind portion circumscribing the second ring portion, wherein the third ring portion is non-contiguous with the second portion, and wherein the third ring portion covers a portion of the second portion of the electrically conductive paths.

8. An electronic component comprising:
   an electrically insulative substrate having a first surface opposite a second surface;
   electrically conductive traces supported by the first surface of the electrically insulative substrate wherein each of the electrically conductive traces extend radially across the first surface of the electrically insulative substrate;
   a first solder mask supported by and physically contacting the electrically conductive traces and the first surface of the electrically insulative substrate wherein the first solder mask has a first ring portion, a second ring portion circumscribing the first ring portion, and a third ring portion circumscribing the second ring portion, wherein a first gap separates the first and second ring portions and exposes a first portion of the electrically conductive traces, wherein a second gap separates the second and third ring portions and exposes a second portion of the electrically conductive traces;
   a semiconductor substrate supported by a central portion of the first surface of the electrically insulative substrate, the semiconductor substrate supporting a semiconductor device, the semiconductor device electrically coupled to the first portion of the electrically conductive traces; and
   a packaging material supported by and covering the semiconductor substrate, the first and second ring portions of the first solder mask, and the first portion of the electrically conductive traces wherein the packaging material covers the first gap of the first solder mask and wherein the packaging material is absent over the second gap of the first solder mask, the second portion of the electrically conductive traces, and the third ring portion of the first solder mask.

9. The electronic component of claim 8 wherein a second solder mask is at the second surface of the electrically insulative substrate, wherein an outer portion of the second solder mask circumscribes an inner portion of the second solder mask, wherein a continuous gap separates the inner and outer portions of the second solder mask, and wherein the continuous gap of the second solder mask underlies the second gap of the first solder mask.

10. The electronic component of claim 8 wherein the electrically insulative substrate has edges coupling together the first and second surfaces and wherein the electrically conductive traces extend to the edges of the electrically insulative substrate.

11. The electronic component of claim 8 wherein the first, second, and third ring portions are concentric with each other and wherein the first gap is continuous to completely separate the first and second rings from each other and wherein the second gap is continuous to completely separate the second and third rings from each other.

12. The electronic component of claim 9 wherein the electrically insulative substrate includes a plurality of holes extending from the first surface to the second surface, wherein the first and second ring portions of the first solder mask cover the plurality of holes along the first surface, wherein the inner portion of the second solder mask covers the plurality of holes along the second surface, and wherein the third ring portion of the first solder mask and the outer portion of the second solder mask are devoid of covering any of the plurality of holes.

13. The electronic component of claim 12 further comprising a plurality of solder bumps at the second surface of the electrically insulative substrate wherein the plurality of solder bumps are spaced apart from each other and arranged in a arid pattern, wherein the second solder mask is devoid of covering the plurality of solder bumps, and wherein the plurality of solder bumps is electrically coupled to the electrically conductive traces through the plurality of holes.

14. The electronic component of claim 13 further comprising a circuit board wherein the plurality of solder bumps are mounted onto the circuit board, wherein the first surface of the electrically insulative substrate faces away from the circuit board.

15. The electronic component of claim 10 wherein the third portion of the first solder mask extends to the edges of the electrically insulative substrate to cover the electrically conductive traces at the edges of the electrically insulative substrate.

16. A method of manufacturing an electronic component comprising:
   providing an electrically insulative substrate having a first surface and a second surface opposite the first surface;
   providing electrically conductive traces over the first surface of the electrically insulative substrate and extending radially across the first surface of the electrically insulative substrate;

providing a first solder mask over the fist surface of the electrically insulative substrate and the electrically conductive traces wherein the first solder mask has a first ring portion, a second ring portion circumscribing the first ring portion, and a third ring portion circumscribing the second ring portion, wherein a first cap separates the first and second ring portions and exposes a first portion of the electrically conductive traces, wherein a second gap separates the second and third ring portions and exposes a second portion of the electrically conductive traces;

mounting a semiconductor substrate over a central portion of the first surface of the electrically insulative substrate wherein the semiconductor substrate supports a semiconductor device;

electrically coupling the semiconductor device to first portion of the electrically conductive traces; and depositing an encapsulant over the semiconductor substrate, the first and second ring portions of the first solder mask, the first gas of the first solder mask, and the first portion of the electrically conductive traces and wherein the packaging material is absent over the second gap of the first solder mask, the second portion of the electrically conductive traces, and the third ring portion of the first solder mask.

17. The method of claim 16 wherein providing the electrically insulative substrate further comprises providing vias in the electrically insulative substrate and further comprising:

positioning solder balls at the second surface of the electrically insulative substrate wherein the solder balls are electrically coupled to the electrically conductive traces through the vias in the electrically insulative substrate; and electrically coupling the solder balls to a circuit board wherein the second surface of the electrically insulative substrate faces towards the circuit board.

18. The method of claim 16 wherein providing the first solder mask further comprises:

providing the first and second rings completely separated from each other;

providing the second and third rings completely separated from each other; and providing the first, second, and third rings concentric with each other.

19. The method of claim 16 further comprising aligning electrical probes to the second portion of the electrically conductive traces at the first surface of the electrically insulative substrate to electrically test the semiconductor device after electrically coupling the semiconductor device to the electrically conductive traces.

20. A method of manufacturing an electronic component comprising:

providing electronic substrate comprising:
   an electrically insulative substrate having first and second surfaces opposite each other;
   electrically conductive paths supported by the first surface of the electrically insulative substrate; and
   an electrically insulative material covering the electrically conductive paths, the electrically insulative material having a first ring portion and a second ring portion circumscribing the first ring portion, wherein the first and second ring portions are non-contiguous with each other, wherein a first portion of the electrically conductive paths is exposed between the first and second ring portions of the electrically insulative material, and wherein a second portion of the electrically conductive paths is exposed beyond the second ring portion of the electrically insulative material;

disposing a semiconductor substrate onto the electronic substrate; and electrically coupling the semiconductor substrate to the electrically conductive paths of the electronic substrate.

21. The method of claim 20 wherein providing the electronic substrate further comprises providing the electrically insulative material with a third ring portion circumscribing the second ring portion, wherein the third ring portion is non-continuous with the second ring portion, and wherein the third ring portion is separated from the second ring portion by a gap, and further comprising singulating the electronic component from a sheet of electronic substrates by clamping the electronic substrate on only the third ring portion of the electrically insulative material and by cutting through the third ring portion of the electrically insulative material.

22. The method of claim 20 wherein providing the electronic substrate further comprises providing vias in the electrically insulative substrate and further comprising forming electrical interconnect structures in a grid pattern at the second surface of the electrically insulative substrate wherein the electrical interconnect structures are electrically coupled to the electrically conductive traces through the vias in the electrically insulative substrate.

23. The method of claim 20 further comprising depositing a packaging material over the semiconductor substrate, the first and second ring portions of the first solder mask, and the first portion of the electrically conductive traces and wherein the packaging material is absent over the second portion of the electrically conductive traces.

* * * * *

UNITED STATES PATENT AND TRADEMARK OFFICE
CERTIFICATE OF CORRECTION

PATENT NO. : 5,903,051
DATED : May 11, 1999
INVENTOR(S) : Jeffrey A. Miks, Dilip D. Patel, Dwight L. Daniels It is certified that error appears in the above-identified patent and that said Letters Patent is hereby corrected as shown below:

Column 7, claim 7,
Line 43, delete "rind" and replace with -- ring --.

Column 8, claim 13,
Line 49, delete "arid" and replace with -- grid --.

Column 9, claim 16,
Line 8, delete "cap" and replace with -- gap --.
Line 23, delete "gas" and replace with -- gap --.

Signed and Sealed this

Fifth Day of March, 2002

*Attest:*

*Attesting Officer*

JAMES E. ROGAN
*Director of the United States Patent and Trademark Office*